(12) United States Patent
Bruls et al.

(10) Patent No.: US 7,199,863 B2
(45) Date of Patent: Apr. 3, 2007

(54) METHOD OF IMAGING USING LITHOGRAPHIC PROJECTION APPARATUS

(75) Inventors: Richard Joseph Bruls, Eindhoven (NL); Marcel Johannes Louis Marie Demarteau, Herten (NL); Bertus Johan Vleeming, Herten (NL); Thomas Leo Maria Hoogenboom, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 62 days.

(21) Appl. No.: 11/017,197

(22) Filed: Dec. 21, 2004

(65) Prior Publication Data

US 2006/0132749 A1 Jun. 22, 2006

(51) Int. Cl.
*G03B 27/72* (2006.01)

(52) U.S. Cl. .......................................... 355/69; 355/77
(58) Field of Classification Search ...................... None
See application file for complete search history.

(56) References Cited

U.S. PATENT DOCUMENTS 6,815,129 B1 11/2004 Bjorkholm et al.
6,898,781 B2* 5/2005 Singh et al. .................. 716/21
6,986,973 B2* 1/2006 Yao et al. ...................... 430/5
2003/0214642 A1* 11/2003 Yang ............................ 355/51
2005/0257187 A1* 11/2005 Gallatin et al. ............... 716/21

* cited by examiner

*Primary Examiner*—D. Rutledge
(74) *Attorney, Agent, or Firm*—Pillsbury Winthrop Shaw Pittman LLP (57) ABSTRACT

A method is provided for compensating for the effect of flare lithographic apparatus. The method includes establishing a power spectral density (PSD) indicative of the spatial frequency of the stray radiation produced by a projection system, and determining, from the PSD, a modulation transfer function (MTF) relating the PSD to a pattern applied by a patterning device to take the effect of flare on the pattern image into account. The MTF is then used to determine the effect of flare on a critical dimension (CD) of the pattern image, and a relationship is established between any change in the CD of the pattern image and a change in the CD of the pattern. The patterning device may then be designed in such a way as to at least partially offset the effect of flare on the CD of the pattern image.

22 Claims, 6 Drawing Sheets

PSD → RMS

METHOD OF IMAGING USING LITHOGRAPHIC PROJECTION APPARATUS

BACKGROUND OF THE INVENTION

1. Field of the Invention

The present invention relates to methods for correction in lithographic projection apparatus, and more particularly to flare correction in lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically by imaging onto a layer of radiation-sensitive material (resist) provided on the substrate. Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is extremely important to ensure that the overlay (juxtaposition) of the various stacked layers is as accurate as possible. For this purpose, a small reference mark is provided at one or more positions on the wafer, thus defining the origin of a coordinate system on the wafer; using optical and electronic components in combination with substrate holder positioning actuators (referred to hereinafter as "alignment system"), this mark can then be re-located each time a new layer has to be juxtaposed on an existing layer, and can be used as an alignment reference. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4, incorporated herein by reference.

There is a need to produce smaller and smaller semiconductor devices, and thus a corresponding need to provide projection systems enabling projection of features with smaller critical dimension (referred to hereinafter as "CD"). Thus, these lithography apparatus are being pushed to their resolution limits, while maintaining sufficient "process latitude" (i.e., sufficient depth of focus and sufficient insensitivity to residual errors in the dose of exposure of irradiated target portions). Therefore, there is a need to minimize factors which can affect the resolution of the apparatus and the process latitude, and consequently there is a need to provide accurate monitoring for these factors.

Many different factors can affect the smallest CD and the process latitude for a given lithographic projection apparatus, such as, for example, residual aberrations of the projection system, focus and dose errors, and the occurrence of stray radiation. In particular, the more flare due to stray radiation that is present in the image of a pattern projected by the projection system, the less the resolution that can be obtained, and the smaller the process latitude will be. Stray radiation may, for example, be caused by scattering of projection beam radiation at contaminating particles and/or defects on surfaces of optical elements of the projection system. Also, optical elements provided with anti-reflection coatings may cause stray radiation due to degradation of materials used for the anti-reflection coatings. Degradation of materials may be a radiation induced effect, and like the number of contaminating particles and/or defects it may increase as a function of time.

CD uniformity (CDU) is a critical imaging parameter for imaging of a single pattern feature. However, if a plurality of pattern features are to be reproduced simultaneously, not only is the individual CDU for each feature of importance, but also the average CD for each feature which should be in the desired target CD range. Any mismatch in the target CD of a feature constitutes an additional contribution to the overall CDU (that is the total CDU for all features). It is therefore important that the reproduction of each pattern feature should be on target as far as possible. This is particularly important when a mask optical proximity correction (OPC) is applied to obtain a specific imaging performance. In this case a single pattern feature (for instance a series of dense horizontal lines) can be printed on target by applying a dose correction. In order to optimize CDU for multiple critical features (for instance simultaneous optimization of dense and isolated lines) additional corrections may be applied to the mask, often referred to as mask OPC. In general the mask OPC is determined once for each mask design and then is not changed. However one of the factors that contributes to the offset with respect to target CD for multiple features is the stray radiation that generally varies over time. The printing performance for multiple features of an exposure tool may therefore be off target as a result of variation in the stray radiation levels even when a mask with OPC is used.

SUMMARY OF THE INVENTION

One aspect of embodiments of the invention is to keep the imaging performance in terms of CDU for multiple features as constant as possible, irrespective of the amount of stray radiation produced.

According to one aspect of the invention, there is provided a method for compensating for the effect of flare due to stray radiation in use of a projection system of lithographic apparatus to project a radiation beam patterned by a patterning device to produce a pattern image in an image plane, the method comprising:

establishing a power spectral density (PSD) indicative of the spatial frequency of the stray radiation produced by the projection system;

determining, from the PSD, a modulation transfer function (MTF) relating the PSD to the pattern applied by the patterning device in such a way that the effect of flare on the pattern image is taken into account;

using the MTF to determine the effect of flare on a critical dimension (CD) of the pattern image;

establishing a relationship between any change in the CD of the pattern image and a change in the CD of the pattern; and designing the patterning device in such a way as to at least partially offset the effect of flare on the CD of the pattern image.

According to another aspect of the invention, there is provided a method of compensating for the effect of flare due to stray radiation in use of a projection system of lithographic apparatus to project a radiation beam patterned by a patterning device to produce a pattern image in an image plane, the method comprising:

monitoring the stray radiation as a function of time;

establishing parameters determining a power spectral density (PSD) indicative of the spatial frequency of the stray radiation produced as a function of time;

establishing the trend in such parameters as a function of time; and using such parameters to determine adjustments to be made to the patterning device to compensate for the effect of flare.

According to another aspect of the invention, there is provided a device manufacturing method comprising using a projection system of lithographic apparatus to project a radiation beam patterned by a patterning device to produce a pattern image in an image plane, the method including compensating for the effect of flare due to stray radiation produced during projection of the patterned beam onto the image plane, such compensation comprising:

establishing a power spectral density (PSD) indicative of the spatial frequency of the stray radiation produced by the projection system;

determining, from the PSD, a modulation transfer function (MTF) relating the PSD to the pattern applied by the patterning device in such a way that the effect of flare on the pattern image is taken into account;

using the MTF to determine the effect of flare on a critical dimension (CD) of the pattern image;

establishing a relationship between any change in the CD of the pattern image and a change in the CD of the pattern; and designing the patterning device in such a way as to at least partially offset the effect of flare on the CD of the pattern image.

According to another aspect of the invention, there is provided a method for compensating for the effect of flare due to stray radiation in use of a projection system of lithographic apparatus to project a radiation beam patterned by a patterning device to produce a pattern image in an image plane, the method comprising:

monitoring the stray radiation as a function of time;

estimating the stray radiation likely to be produced at a predetermined end of lifetime;

determining the likely effect of flare on a critical dimension (CD) of the pattern image at the end of lifetime;

setting the design of the patterning device in such a way as to at least partially offset the likely effect of flare on the CD of the pattern image at the end of lifetime;

establishing a power spectral density (PSD) indicative of the spatial frequency of the stray radiation produced;

establishing the effect of flare on the CD of the pattern image for the current level of stray radiation; and applying an amount of moving standard deviation MSDxy indicative of the the effect of vibration in the image plane such that the sum of the projected change in CD due to changing MSDxy at the end of lifetime and the projected change in CD due to flare at the end of lifetime is substantially constant over the likely lifetime.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE DRAWINGS

Figure 1:
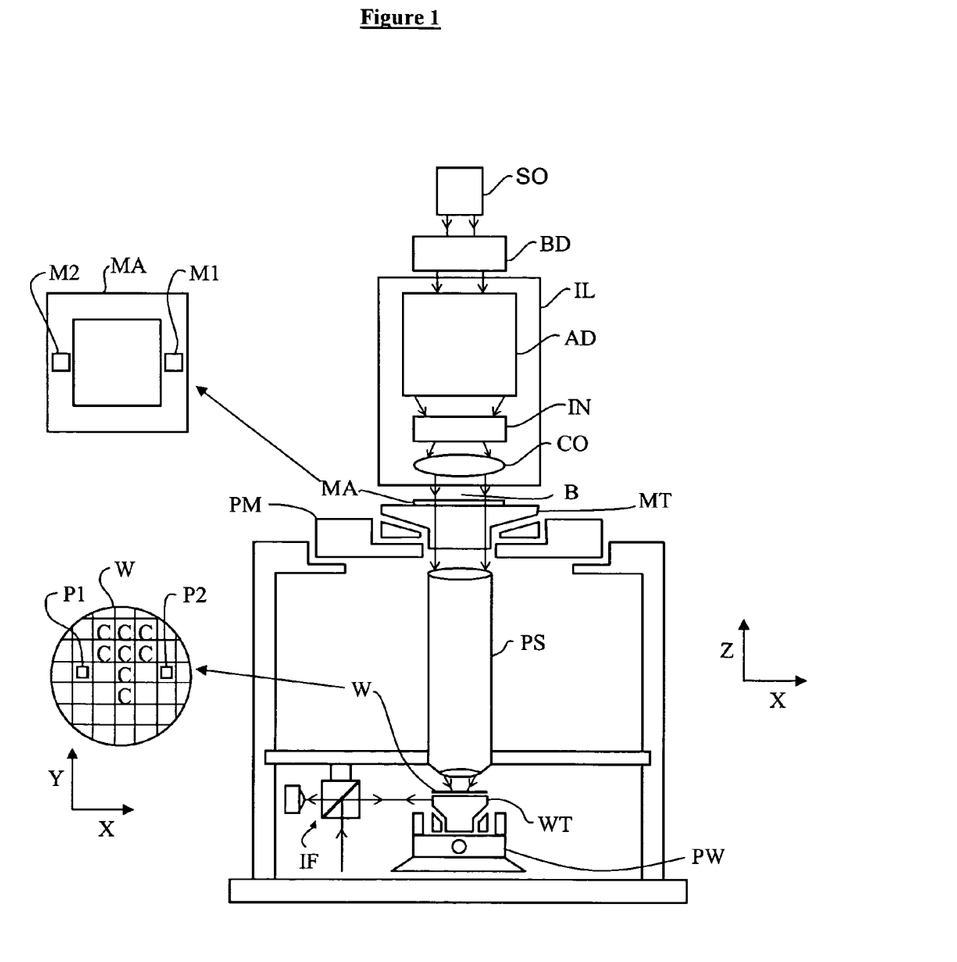
FIG. 1 depicts lithographic apparatus with which the invention may be used.

FIG. 1 schematically depicts a lithographic apparatus according to one embodiment of the invention. The apparatus comprises:

an illumination system (illuminator) IL configured to condition a radiation beam B (e.g., UV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In use of the apparatus very important source of scattering is the surface roughness of the lens elements of the projection system. Surface topography errors are generally viewed as the sum of two independent components, figure and finish.

Figure errors are those left by the shaping process in manufacture of the lens and generally have spatial wavelengths ranging from $D_0$, the size of the optical element (either refractive or reflective) down to, say $D_0/10$. They are usually measured by interferometry and expressed in terms of Zernike polynomials. With knowledge on how the figure errors on the distinct lens surfaces propagate to the lens pupil, they can be described in terms of Zernike aberrations in the lens pupil. Alternatively the combined effect of figure errors can be measured in the assembled system by a through-the-lens interferometer, as is done by all lens manufacturers. It is therefore possible to distinguish between the effect of figure errors (causing Zernikes) and finishing errors.

Finish errors are errors left by the finishing or polishing process and cover the entire spatial wavelength spectrum from near-atomic dimensions to the lens diameter. They usually have to be measured by a combination of various methods, because none of these methods cover the entire spatial frequency range. The high spatial frequencies are usually measured by one- or two-dimensional profilometry, for example by using an atomic force microscope (AFM). Phase microscopy can be used for the lower spatial frequencies. Even surface scatterometry itself can be used to characterise the surface roughness, if it is known how to solve the inverse scattering problem.

It is impossible to measure the surface profile z(x,y) over the complete lens down to near-atomic scale. Lens surface roughness is generally characterised by either the profile (or 1-D) or area (2-D) power spectral density (PSD). The area power spectral density is defined by:

$$PSD(\vec{f}) = \lim_{A \to \infty} \frac{1}{A} \left| \int_A z(\vec{r}) \cdot e^{2\pi i \vec{f} \cdot \vec{r}} \cdot d\vec{r} \right|^2$$

where $f$ is the spatial frequency (with dimension [1/m]) with respect to the pupil radius, A is the observation area of the measurement, z(r) is the autocorrelation function for the roughness distribution, and r is the space coordinate.

Figure 3:
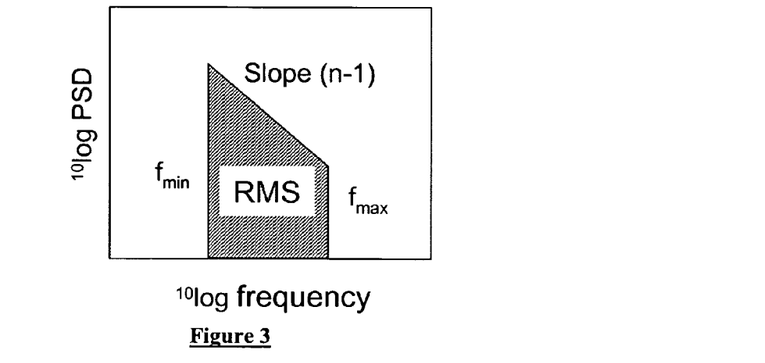

In practice, one has to be aware of the bandwidth limitations of each of the characterising methods. All methods are limited at low frequencies by the length of the scan or size of the observed area and at high frequencies by the resolution of the method and density of the data. Usually the power spectral density is presented in a Log-Log plot, as shown in FIG. 3 with the value of the minimum spatial frequency $f_{min}$ being chosen to avoid divergence on the lower side of the integral (that is to avoid the region of aberrations) and the maximum spatial frequency $f_{max}$ being in practice quite large.

To more precisely assess the stray radiation condition of a projection system, it is useful to identify "ranges" of stray radiation. A point in the object plane and irradiated by radiation of the projection beam is traversed by rays of the projection beam. These rays subsequently traverse the projection system whereby a sub-set of the rays is diverted due to scattering. This sub-set of rays intersect a plane conjugated to the object plane (referred to hereinafter as "image plane") in an area comprising the geometrical image of said point at a corresponding sub-set of distances from that geometrical image point. Said distances can be ordered into ranges of distances, and these ranges constitute "ranges" of stray radiation. Generally, the projection beam of radiation provided by the radiation system is such that the rays traversing said point in the object plane are symmetrically distributed with respect to the optical axis of the projection apparatus. However, in spite of this situation, the spatial intensity distribution of the stray radiation in the image plane may not be symmetric with respect to the geometrical image point. Thus, the range of stray radiation may be an asymmetric function of X and Y coordinates of a Cartesian coordinate system in the image plane with its origin O coincident with the geometric image point. This may be indicative of a certain class of defects in the projection system.

Measures for stray radiation in different ranges can be used in a simulator to estimate the degradation of CD, and hence to estimate the effect on the resolution performance of the lithographic projection apparatus. The resolution performance can become out of tolerance and therefore there is the problem of accurately monitoring stray radiation for different ranges, so that preventive measures such as cleaning lens surfaces can be taken in time. Furthermore, although lithographic projection apparatus is generally provided with sensors to measure resolution performance, it is not possible from such measurements to assess in situ and sufficiently fast the presence of stray radiation in different ranges and to assess the necessity of taking appropriate measures to reduce stray radiation.

A transmission image sensor TIS can be used to determine the lateral position and best focus position (i.e., horizontal and vertical position) of the projected image from the mask under the projection lens. A transmission image sensor TIS is inset into a physical reference surface associated with the substrate table WT. In a particular embodiment, two sensors are mounted on fiducial plates mounted to the top surface of the substrate table WT, at diagonally opposite positions outside the area covered by the wafer W. The TIS is used to determine directly the vertical (and horizontal) position of the aerial image of the projection lens. It comprises apertures in the respective surface close behind which is placed a photodetector sensitive to the radiation used for the exposure process.

To determine the position of the focal plane, the projection lens projects into space an image of a pattern provided on the mask MA and having contrasting light and dark regions. The substrate table is then scanned horizontally (in one or optionally two directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the pattern image has the greatest contrast, and hence indicates the plane of optimum focus. The horizontal level at which the rate of change is highest indicates the aerial image's lateral position. An example of a TIS of this type is described in greater detail in U.S. Pat. No. 4,540,277, incorporated herein by reference. Advantages of such a TIS include robustness and speed, because it is a direct measurement technique not involving exposure of a resist.

In a particular technique, a spot sensor which is part of the TIS is used, the spot sensor comprising a photodiode with an extremely small detection area. However, any other suitable spot sensor, comprising a radiation sensor with small detection area, could be used apart from sensors associated with the TIS. One specific TIS comprises a square detector aperture with dimensions 28 µm×28 µm in front of a photodiode.

By way of example, the mean wavelength of the projection beam may be 248 nm, and the NA of a patterned beam impinging on the image plane may be 0.7. Furthermore the test pattern for measuring stray radiation comprises a square opaque area with sides of a length SO, the opaque area being surrounded by a transmissive area. The geometrical image of the opaque area is a square, substantially unexposed area within an exposed area and having sides of a length SI given by the modulus value |M×SO|. For example, with SO=120 µm, and M=0.25, we have SI=30 µm. The shape of the square detector aperture of the TIS sensor, with sides of a length SD of 28 µm, is congruent to a notional shape having an edge which is obtained from the shape of the unexposed area by displacing each line element constituting the shape of that area inwardly of the area by a distance 1 µm (note that λ/NA is smaller than 1 µm). Accordingly, when the detector aperture of the TIS is positioned such that its edge coincides with the edge of the notional shape, primarily stray radiation of a range greater than 1 µm is detected by the TIS sensor. The TIS detector aperture is then angularly aligned with respect to the opaque area, and centred with respect to the image.

A measurement of a stray radiation condition of a projection system involves at least two subsequent measurements, whereby the detector aperture with its edge is positioned in two different positions and with respect to the image of the opaque area. In the first position, that is the above mentioned centred and aligned position, the stray radiation is measured, and the signal generated by the detector in response to the impinging stray radiation is a stray radiation parameter S1. In the second position the TIS sensor is irradiated directly by the projection beam; the detector signal S2 is the reference parameter to be used for normalizing S1, such that a stray radiation coefficient Co is obtained: Co=S1/S2. In a first approximation the coefficient Co is representative for stray radiation present in the range R given by R=[(1/2)×(SI−SD), infinity]; for the present embodiment, the range is R=[1 µm, infty]. Here, the term "infinity" is not to be taken literally, but to be understood to indicate that at the long end the range of stray radiation which can be detected is limited by the maximum size of a target portion that can be irradiated by the projection beam.

In one stray radiation measurement technique the test pattern comprises a series of square, opaque isolated areas, with sides of increasing length, for example three such areas having side lengths of respectively 160 µm, 252 µm and 400 µm. Stray radiation coefficients Co1, Co2 and Co3 representative, to a first approximation, of stray radiation in the ranges R1=[6 µm, infinity], R2=[17.5 µm, infinity], and R3=[36 µm, infinity] can then be determined. In one embodimetn, the test pattern comprises a plurality of series at a corresponding plurality of positions in the field of the projection system, so that an assessment of the stray radiation condition of the projection system for different field positions can be made. Using the positioning devices of the alignment system to subsequently position the detector aperture of the TIS at the required measurement positions as defined with respect to each image of the isolated area of the series, fast in situ stray radiation condition determination is possible. The distance between the isolated areas should be much larger than the extent of the sides such that stray radiation measurements are not affected by the presence of neighboring isolated areas.

Other techniques can also be used to analyze the image. For example a so-called ILIAS sensing arrangement as described in WO 01/63233 may be used.

A procedure will now be described for determining the effect of long and short range flare on the features of the image applied to the target substrate. As will be described more fully below, the quantity and distribution of stray radiation as a result of such flare depends both on the density of the features of the pattern applied by the mask, and on the length of time for which the mask has been used.

Figure 2:
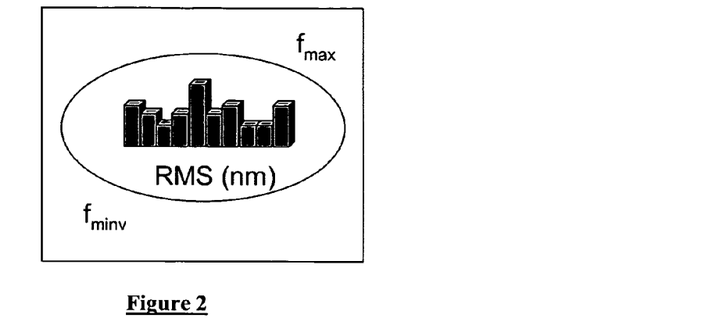
FIGS. 2 to 6 are explanatory diagrams illustrating long and short range flare modeling procedures utilized in embodiments of the invention.
Figure 4:
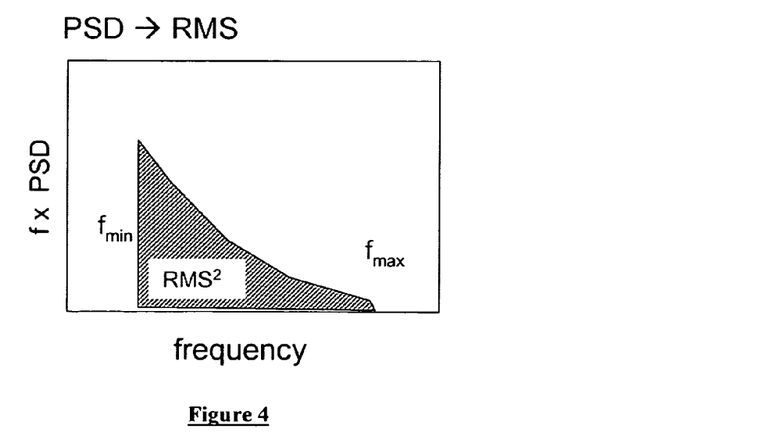

In this procedure it is first necessary to determine the PSD function of the overall projection system which is a Fourier transform of the auto-variance function and which characterizes the exit pupil roughness in frequency space. This can be done in two ways. Firstly, as shown diagrammatically in FIG. 2, the surface roughness of the projection lens can be directly measured, for example using an atomic force microscope (AFM), and expressed for example in terms of the RMS (root mean square) value of the surface roughness. The PSD as obtained from roughness data can be described assuming a fractal or ABC model, and the RMS can be derived from the PSD using:

$$\mathrm{RMS}^2 = \int_{f_{\min}}^{f_{\max}} 2\pi \cdot PSD \cdot f \, df$$

where fmin is a minimum spatial frequency and fmax is a maximum spatial frequency. Several models have been developed to describe the measured power spectra. This is shown diagrammatically in FIG. 4. All models can be generalized to one specific shape, the so-called ABC or K-correlation model, as described in E. L. Church "The Optimal Estimation of Finish Parameters", SPIE Vol. 1530, p. 71–85:

$$PSD(f) = \frac{A}{[1 + (B \cdot f)^2]^{(c+1)/2}}$$

where A, B, and C are the adjustable finish parameters. Spectra described by the ABC model are isotropic and a smooth function of frequency. Furthermore, they show an inverse-power-law or fractal-like character (this is because polishing is not expected to involve a characteristic length scale). At lower frequencies this fractal behaviour may break down due to an intrinsic outer length scale that is shorter than the part size.

The logarithm of the simplified (fractal) lens PSD may then be plotted against the logarithm of the spatial frequency for values between the minimum frequency fmin and the maximum frequency fmax, as shown in FIG. 3 for the case in which a fractal character PSD=K/f''+1 is assumed.

The MTF can be derived from the PSD using the auto-covariance function as discussed in more detail below:

$$C(\sigma_x, \sigma_y) = \int_{-\infty}^{\infty}\int_{-\infty}^{\infty} PSD(f_x, f_y)\exp(2\pi i[f_x\sigma_x + f_y\sigma_y])\,df_x\,df_y$$

The Fourier transform $\Im\{PSF_{flare}(x,y)\}$ is derived from the auto-covariance function:

$$\Im\{PSF_{flare}(x,y)\} = exp(-4k^2[\sigma_\Sigma^2 - C(f_x^{sp}, f_y^{sp})]) \approx 1 - 4k^2(\sigma_\Sigma^2 - C(f_x^{sp}, f_y^{sp}))$$

which is also referred to as MTF.

The impact on the CD of the pattern to be reproduced can then be determined using:

$$\tilde{I}_{flare}(f_x^{sp}, f_y^{sp}) = \tilde{I}_{no\ flare}(f_x^{sp}, f_y^{sp}) \cdot \Im\{PSF_{flare}(x,y)\}$$

which is the Fourier transform of $I_{flare}(x,y) = I_{no\ flare}(x,y) PSF_{flare}(x,y)$. Therefore in Fourier space the Fourier transform of the aerial image of the pattern of interest can be multiplied by the MTF $(=\Im\{PSF_{flare}(x,y)\})$ to obtain the impact of flare on imaging.

Brief consideration will be given below to the manner in which the MTF may be derived mathematically. For a rough surface the height $h(x)$ can be measured as a function of the space coordinate x. The function $h(x)$ can be thought of as a random function, and the autocorrelation of $h(x)$ is given by:

$$C(x) = \int h(x')h(x+x')dx'$$

The PSD is given by the Fourier transform $\Im$ of this function and, as for any convolution, the Fourier transform $\Im$ is given by the product of the Fourier transforms of the integrands:

$$PSD(f) = \Im(C) = |\Im(h)|^2$$

which represents the intensity of the spectrum of the height h in the frequency domain. It is worth noting that this is still true for random functions [Wiener-Khinchin theorem].

In applying this to a projection system it should be appreciated that the phases are of interest here. The phase enters the electric field E as:

$$E = E_0 \cdot e^{-ik(h-<h>)} = E_0 \cdot e^{-i\Phi}$$

where k is the wavevector $k=2\pi/\lambda$, and $<h>$ is the average of the height h. Therefore contributions $\Delta I$ (in the imaging integral) to the resultant fields are proportional to ensemble-averages over phase-differences [from now on the tilde denotes (phase-) differences]:

$$\Delta I \propto \langle e^{-i\tilde{\phi}} \rangle$$

Furthermore an assumption is made that $\Phi$ (or h since they are proportional) represents a stationary Gaussian random process. This means that the higher-order correlations all decompose in products of $2^{nd}$ order moment or lower (implying that for a zero-average process all odd moments vanish):

$$\langle e^{-i\tilde{\phi}} \rangle = \sum_{n=0}^{\infty} \frac{(-i)^n \cdot \langle \tilde{\phi}^n \rangle}{n!} = \sum_{n=0}^{\infty} \frac{(-)^n \langle \tilde{\phi}^2 \rangle^n}{(2n)!} \cdot \frac{(2n)!}{n!2^n} = e^{-\langle \tilde{h} \rangle^2 k^2/2}$$

$\langle \tilde{\Phi} \rangle^2$ is of course related to the autocorrelation function C from the expression given earlier. The extra combinatorial factor in the third expression stems from the fact that the factors $\Phi$ in $<\Phi^{2n}>$ can be rearranged in $(2n)!$ ways, but the $n!$ pairs $<\Phi^2>$ that are from them are equivalent, and moreover within each pair the order is irrelevant (factor $2^n$). The relationship with the autocorrelation function C follows from:

$$\langle (\tilde{h}_{1} - \tilde{h}_{2})^2 \rangle = 2 <\tilde{h}>^{2} - C = 2*(RMS-C)$$

This average of the phase-factors from the pupil is the MTF which is accordingly given by:

$$MTF = e^{-k^2[RMS-C]}$$

Exactly the same reasoning can be followed for 2D-roughness, and the same expressions result.

The frequency spectrum in the pupil is multiplied by the MTF. Alternatively, the Fourier transform of the MTF is convoluted with the image at the wafer plane. The Fourier transform of the MTF is also called the point-spread function (PSF) since the convolution will blur the image.

Since the height is stochastic of origin it is reasonable to expect that the frequency spectrum does not consist of a fixed number of frequencies. Instead often a smooth dependence on frequency is considered, for instance $PSD(f)=K/f^{n+1}$. By assuming that the 2D PSD is isotropic the autocorrelation function C can be found from the expression:

$$C(\sigma) = \Im(PSD) = \int_0^\infty 2\pi f \cdot PSD(f) \cdot J_0(2\pi f\sigma) \cdot df$$

The MTF is therefore derived from the previously measured or determined PSD, and it is the MTF that is used in the simulation model.

If the expression $PSD(f)=K/f^{n+1}$ is used, it is possible to calculate the intensity below a dark Kirk line of width 2b as:

$$I(b) = 4K \int_0^{\pi/2} \int_{b/\cos(\theta)}^{\infty} \frac{1}{r^n} dr d\theta =$$

$$\frac{4K}{(n-1)b^{(n-1)}} \int_0^{\pi/2} \cos(\theta)^{(n-1)} d\theta = \frac{4K}{(n-1)b^{(n-1)}} B(n/2, 1/2)$$

where B is the beta-function. It should be noted that the variable that is conjugate to x in the pupil is the real space variable measured in units of wavelength. A fit of the centre-intensities of a series of boxes with different sizes b can then be used to determine from this the number K and/or the power n.

Figure 5:
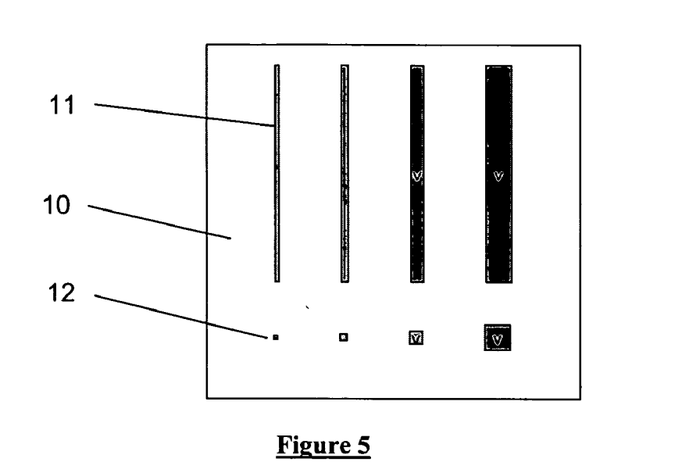
Figure 6:
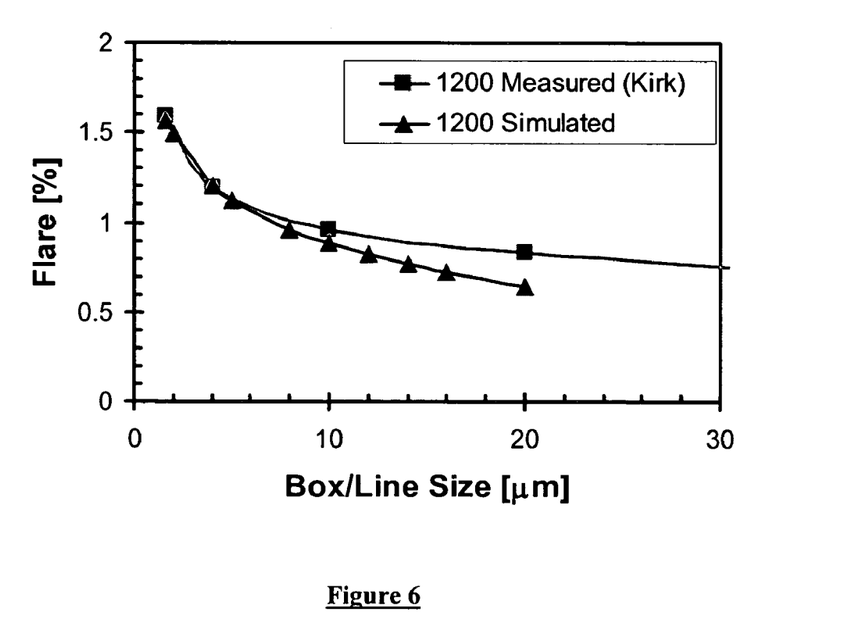

Alternatively the PSD can be determined by an optical technique in which a flare test reticle is used in the apparatus, and the resulting patterned radiation beam is detected. As shown in FIG. 5, the flare test reticle 10 has a Kirk/Samos structure consisting of different thickness lines 11 and/or different size boxes 12, as described in J. P. Kirk, "Scattered Light in Photolithographic Lenses", SPIE 2197, 566 (1994). The features of the pattern resulting from exposure of the flare test reticle are detected in the image plane, and the percentage of stray radiation is plotted as a function of the line and box sizes, as shown in FIG. 6. From the experimental data in FIG. 6 the PSD parameters can be established resulting in RMS=1.95 nm, n=1.28, when using fmin=5 cycle/pupil radius, fmax=$10^6$ cycle/pupil radius. Using these parameters the Kirk result can be simulated (also depicted in FIG. 6). FIG. 6 shows the agreement between experimental and calculated data indicating the validity of the procedure. Deviations at larger box sizes can be explained by the simulation conditions used (finite size of simulation window). As expected this indicates that the effect of the stray radiation increases as the line or box size decreases. The measured flare data can then be translated into PSD parameters (RMS, n, fmin, fmax), and the MTF determined from the PSD as previously described.

Figure 7:
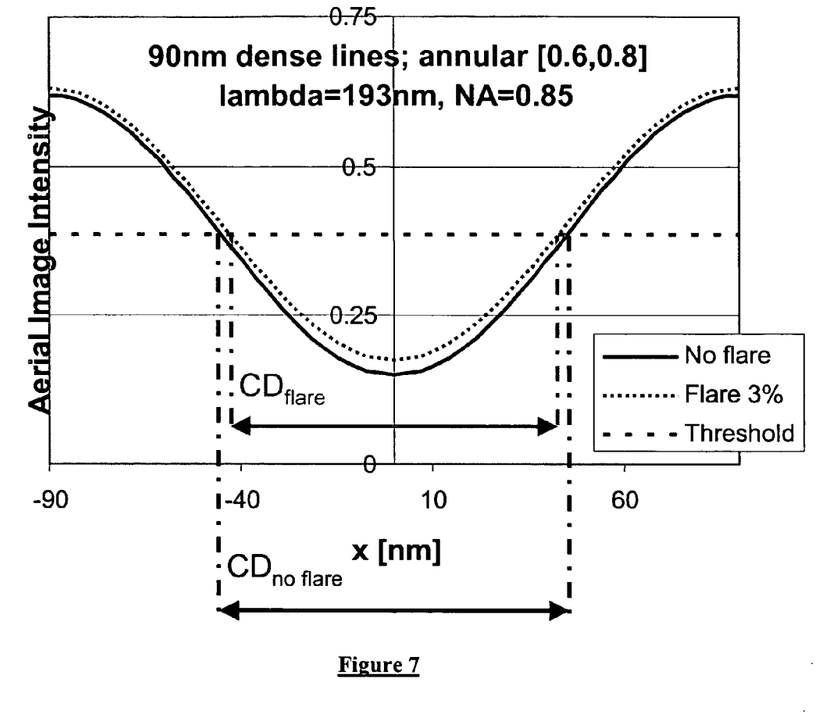
FIG. 7 is a diagram illustrating the effect of flare on the CD.

The above procedures are used as a simple description of PSD with a limited number of parameters (fractal model PSD=K/f$^{(n-1)}$) to calculate the MTF. This may then be used to simulate an aerial image of a pattern on the mask. It should be noted that, in order to take the effect of flare fully into account, a sufficient amount of the surrounding pattern needs to be included in the simulation. For example, in order to take account of flare originating from a distance of 5 μm from the pattern of interest, a simulation box of 10×10 μm would be needed with the pattern of interest in the centre of the simulation box. For practical simulation reasons, the surroundings of the pattern that are not closer than 5 times the exposure wavelength (for 193 nm this results in a box of 2×2 μm) can be approximated by an average transmission of the surroundings. The intensity distribution of the aerial image can then be plotted as shown in FIG. 7 in which the solid line indicates the intensity distribution for the image in the absence of flare, and the broken line indicates the intensity distribution incorporating the effect of flare. When the CD is considered in relation to a particular threshold, it will be appreciated that the effect of the flare is to provide a narrower CD when the effect of flare is considered as compared with the CD without flare (in the particular case where line/spaces on the reticle are reproduced using a positive resist).

Figure 8:
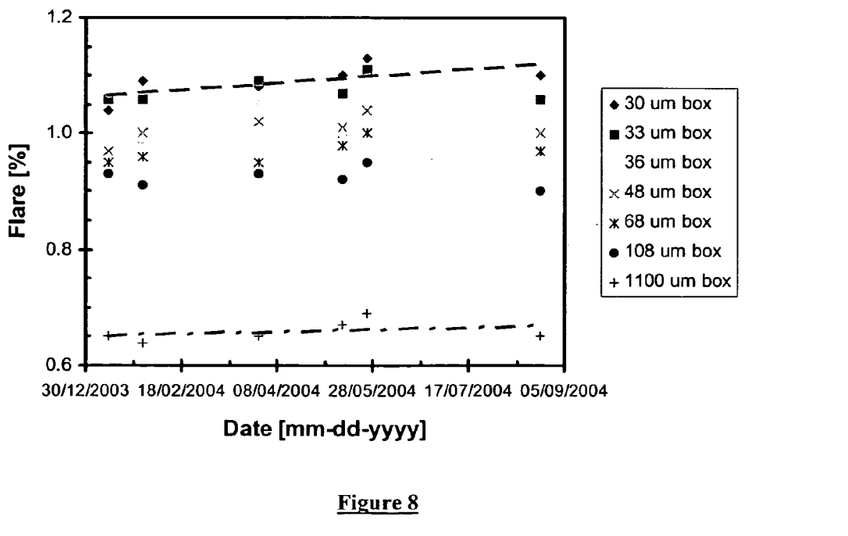
FIGS. 8 to 10 are graphs illustrating the manner in which the system PSD is determined.

Such flare modeling can also take account of the trend of increasing flare with time by detecting the images of different sized boxes at different times. FIG. 8 is a graph showing the values detected at different times for the proportion of flare with different sized boxes of dimensions 30, 33, 36, 48, 68, 108 and 1100 μm.

Figure 9:
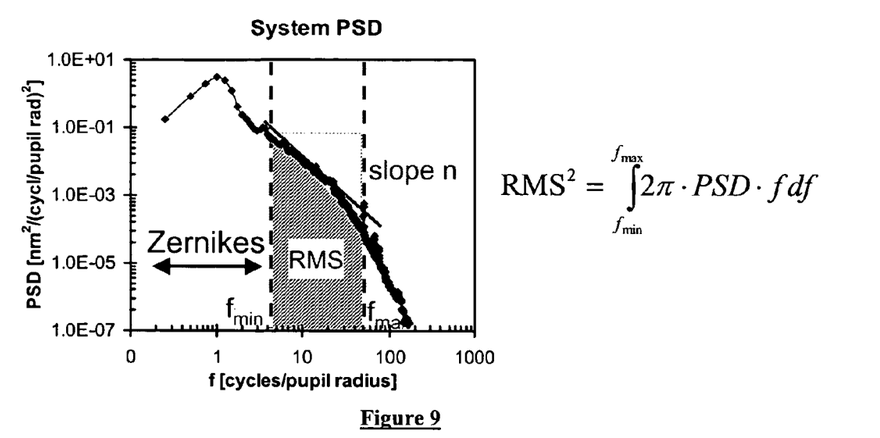

FIG. 9 shows the system PSD (being a linear summation of the individual PSD of the lens elements) plotted against the spatial frequency expressed in cycles per pupil radius, with assumed fractal behaviour PSD=K/f$^n$. This shows that a simple fractal approximation of the PSD sufficiently describes the measured PSD. The area of interest is that part of the curve between fmin and fmax in which the stray radiation is expressed in terms of the auto-covariance function. At lower frequency less than fmin the stray radiation is expressed in deterministic Zernike-polynomials.

Figure 10:
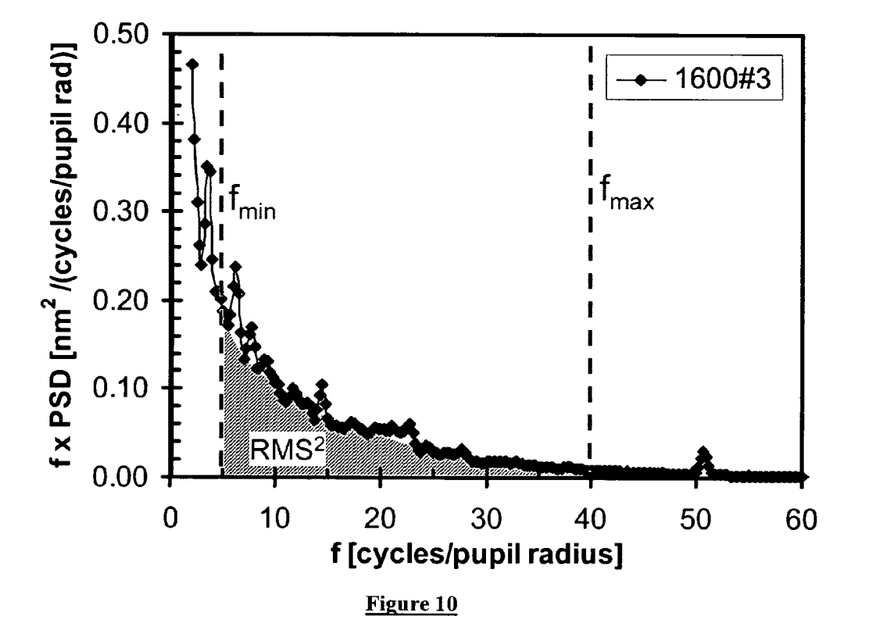

FIG. 10 is a graph of f×PSD against the frequency f. The system RMS is determined by f×PSD, so that this graph indicates the very low level of this value above fmax, and enables the slope n in FIG. 9 to be more accurately predicted.

Figure 11:
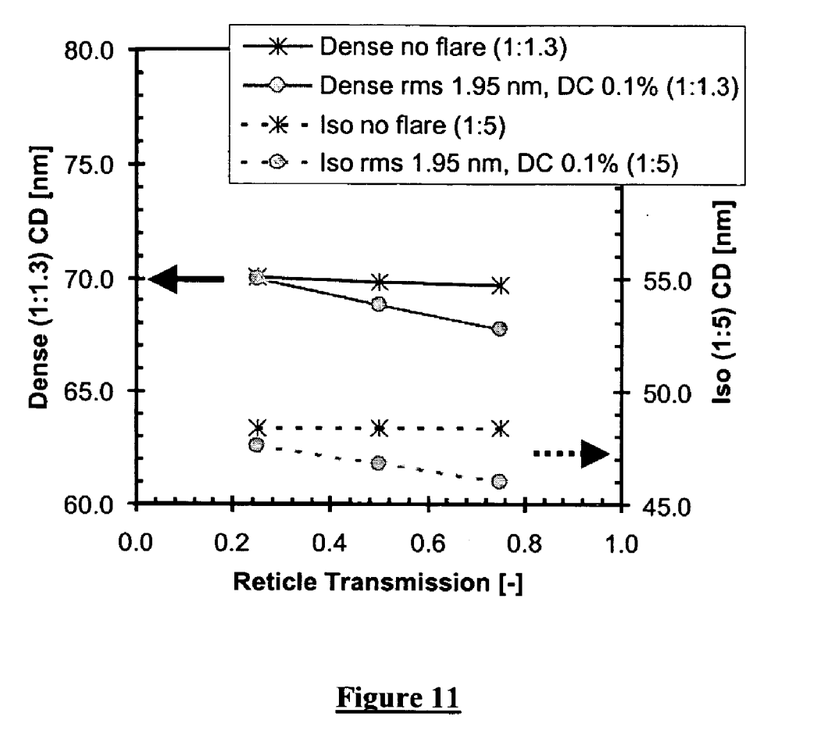
FIG. 11 is a graph showing the CD measurements for various reticle transmission values.

FIG. 11 shows the effect of flare on CD for different reticle transmission values both for the case of a dense reticle pattern, Dense CD, (line width to spacing ratio 1:1.3) and a pattern having isolated lines, Iso CD (line width to spacing ratio 1:5). This graph shows readings for the Dense CD (solid lines) and Iso CD (broken lines) when no flare is present and when flare is present (flare PSD parameters: RMS=1.95 nm, n=1.28, fmin=5 cycle/pupil radius, fmax=10$^6$ cycle/pupil radius; illumination conditions: NA=0.88, σ=0.85/0.55, using a 193 nm exposure tool). This shows that the CD decreases for increasing reticle transmission where flare is present but is substantially unaffected where no flare is present.

Thus an example of a method in accordance with the invention comprises the following steps:

1. Establish (characterize flare by) the PSD in terms of an ABC model;

2. Evaluate MTF from this model;

3. Use the MTF to calculate the impact of flare on CD of pattern to be printed;

4. Establish the relationship between the change in reticle CD and the mask CD. In general this is a multiplication factor often referred to as MEF (Mask Error Factor) or MEEF (Mask Error Enhancement Factor);

5. The CD change due to flare is now expressed in terms of mask CD change;

6. The mask design is then changed/adapted in such a way that the impact of flare is compensated In step 1 the PSD can be established by one of several methods:

a) surface roughness measuring techniques using $$RMS^2 = \int_{f_{min}}^{f_{max}} 2\pi \cdot PSD \cdot f \, df$$

b) wave front measurements c) using experimental data based on multiple box or line sizes (often referred to as the Kirk method). The amount of flare [%] as function of the line/box size can be fitted assuming a fractal PSD using Flare [%]~(RMS/λ)$^2$·100% d) The PSD can be also described using an ABC or fractal model that is applicable within a specific frequency (see for example FIG. 9 for which it seems appropriate to describe the PSD with two slopes, one for f=5–30 and one for f=30–200, instead of using only one slope)

In step 3, in order to calculate correctly the impact of flare on the CD, the simulation area around the feature should be sufficiently large. For example, in order to take flare originating from a location 5 μm away from the pattern of interest, the simulation window should be at least 10 μm×10 μm with the pattern of interest located in the centre of the simulation window.

In steps 5 and 6, the CD change can alternatively be expressed in terms of exposure dose change. Locally adapting for the exposure dose can potentially also be used to compensate the effect of flare on CD change for multiple features. This dose compensation might be especially efficient if the pattern density is very slowly changing over the exposure field.

An alternative method in accordance with the invention may include the steps of:

(i) Monitor the flare in the exposure tool as a function of time;

(ii) Establish the PSD parameters as a function of time;

(iii) Establish the trend in the parameters that describe the PSD as a function of time;

(iv) Use the time dependent PSD parameters to predict future mask adjustments as provided in the sequence of steps 1–6 above As the lifetime of a mask is substantially shorter than the lifetime of the exposure tool, it makes sense to use the above described alternative method of the invention. It is therefore possible to monitor the flare trend of the apparatus using a simulator in order to predict the impact of flare on the CD for the pattern feature of interest of the required image, and to design the mask to produce that image accordingly. Other imaging parameters can similarly be monitored and predicted using trend charts. These trends can be incorporated in litho predictions (CD variation or image displacement) so as to enable them potentially to be corrected in the mask design. Such mask design can also take into account the flare variation during the lifetime of the exposure tool, for example by using average predicted image parameters over the lifetime to design the necessary features of the mask.

As an alternative to using a trend simulator in this manner as input for the mask design, the trend simulator can be used to mimic the tool performance as it approaches the end of its lifetime. Since the effect of flare is in principle equivalent to a contrast degradation of the tool, this contrast degradation can be balanced by decreasing the contrast loss introduced into the system by reticle and wafer stage vibrations in the X-Y plane often referred to as MSDxy (moving standard deviation). If the total contrast loss over the tool lifetime due to flare (or potentially other parameters) is known and the critical contrast parameters are monitored, it is possible to keep the tool image performance substantially constant by use of the relationship:

Contrast loss (end of life)=Contrast loss (MSDxy)+Contrast loss (flare)=constant over time.

Using the contrast gain by reducing MSDxy to compensate for the decrease in contrast (due to flare) over time in order to maintain the contrast loss substantially constant enables the reticle design to be kept constant over time without adversely affecting imaging performance. This enables constant imaging performance over time.

An embodiment of a sequence of steps for implementing an embodiment of this method is:

1) Monitor the flare in the exposure tool as a function of time;

2) Estimate the flare level at end of exposure tool lifetime;

3) Calculate impact on CD at end of life time exposure tool;

4) Establish reticle design based on end of lifetime situation;

5) Establish the momentary applicable PSD parameters for the exposure tool;

6) Establish impact on CD for current exposure tool flare level;

7) Calculate the amount of MSDxy (reticle and/or waferstage dynamics in xy plane) needed to mimic the current exposure tool performance to the end of lifetime performance;

8) Introduce within the exposure tool an amount of MSDxy in such a way that: Total contrast (exposure tool) =contrast (MSDxy)+contrast (Flare)=constant over lifetime.

Because of the constant imaging performance obtainable by such compensation for the effect of flare, this enables better usability of the apparatus with more stable imaging performance over tool lifetime, as well as potentially resulting in greater yield of exposed product.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Furthermore the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system." Furthermore the term "lens", where the context allows, may refer to any one or combinations of various types of optical components, including refractive, reflective, magnetic, electromagnetic and electrostatic optical components.

The "illumination system" may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of compensating for the effect of flare due to stray radiation in use of a projection system of a lithographic apparatus to project a radiation beam patterned by a patterning device to produce a pattern image in an image plane, the method comprising:

establishing a power spectral density (PSD) indicative of a spatial frequency of the stray radiation produced by the projection system;

determining, from the PSD, a modulation transfer function (MTF) relating the PSD to the pattern applied by the patterning device based at least in part on an effect of flare on the pattern image;

using the MTF to determine the effect of flare on a critical dimension (CD) of the pattern image;

establishing a relationship between a change in the CD of the pattern image and a change in the CD of the pattern; and designing the patterning device, based on the relationship between a change in the CD of the pattern image and a change in the CD of the pattern, in such a way as to at least partially offset the effect of flare on the CD of the pattern image.

2. A method according to claim 1, wherein the PSD is established by directly measuring a the surface roughness of the projection system.

3. A method according to claim 2, wherein the PSD is established using $$RMS^2 = \int_{f_{min}}^{f_{max}} 2\pi \cdot PSD \cdot f \, df$$

where RMS is the root mean square value of the surface roughness and fmin and fmax are minimum and maximum values of the spatial frequency of the stray radiation.

4. A method according to claim 1, wherein the PSD is established by monitoring with respect to time stray radiation produced by a reference patterning device to produce a pattern image incorporating a plurality of different sized reference features in the image plane, and determining the PSD from an observed effect of flare on the different sized reference features.

5. A method according to claim 1, wherein the PSD is approximated using a fractal model.

6. A method according to claim 1, wherein an auto-covariance function is determined from $$\left(C(\sigma_x, \sigma_y) = \int_{-\infty}^{\infty}\int_{-\infty}^{\infty} PSD(f_x, f_y) \exp(2\pi i[f_x\sigma_x + f_y\sigma_y]) \, df_x \, df_y\right)$$

which is then used to calculate the MTF from the Fourier transform $\Im\{PSF_{flare}(x, y)\}$ of the point spread function (PSF).

7. A method according to claim 1, wherein the effect of flare on the CD of the pattern image is determined by multiplying the Fourier transform of the pattern image by the MTF.

8. A method according to claim 1, wherein the relationship between the CD of the pattern image and the CD of the pattern is determined using a mask error factor (MEF).

9. A method of compensating for effects of flare due to stray radiation in use of a projection system of a lithographic apparatus to project a radiation beam patterned by a patterning device to produce a pattern image in an image plane, the method comprising:

monitoring the stray radiation as a function of time;

establishing parameters determining a power spectral density (PSD) indicative of a spatial frequency of the stray radiation produced as a function of time;

establishing a trend in the parameters as a function of time; and using the parameters to determine adjustments to be made to the patterning device to compensate for the effect of flare.

10. A method according to claim 9, comprising establishing the PSD by directly measuring a surface roughness of the projection system.

11. A method according to claim 10, wherein the PSD is established using $$RMS^2 = \int_{f_{min}}^{f_{max}} 2\pi \cdot PSD \cdot f \, df$$

where RMS is the root mean square value of the surface roughness and fmin and fmax are minimum and maximum values of the spatial frequency of the stray radiation.

12. A method according to claim 9, comprising establishing the PSD by monitoring with respect to time stray radiation produced by a reference patterning device to produce a pattern image incorporating a plurality of different sized reference features in the image plane, and determining the PSD from an observed effect of flare on the different sized reference features.

13. A method according to claim 9, wherein the PSD is approximated using a fractal model.

14. A method according to claim 9, further comprising:

establishing the PSD;

determining, from the PSD, a modulation transfer function (MTF) relating the PSD to the pattern applied by the patterning device based at least in part on an effect of flare on the pattern image;

using the MTF to determine the effect of flare on a critical dimension (CD) of the pattern image;

establishing a relationship between a change in the CD of the pattern image and a change in the CD of the pattern; and designing the patterning device, based on the relationship between a change in the CD of the pattern image and a change in the CD of the pattern, in such a way as to at least partially offset the effect of flare on the CD of the pattern image.

15. A device manufacturing method comprising using a projection system of a lithographic apparatus to project a radiation beam patterned by a patterned by a patterning device to produce a pattern image in an image plane, the method including compensating for the effect of flare due to stray radiation by:

establishing a power spectral density (PSD) indicative of a spatial frequency of the stray radiation produced by the projection system;

determining, from the PSD, a modulation transfer function (MTF) relating the PSD to the pattern applied by the patterning device based at least in part on an effect of flare on the pattern image;

using the MTF to determine the effect of flare on a critical dimension (CD) of the pattern image; and establishing a relationship between a change in the CD of the pattern image and a change in the CD of the pattern.

16. A method according to claim 15, wherein the PSD is established by directly measuring a surface roughness of the projection system.

17. A method according to claim 16, wherein the PSD is established using $$RMS^2 = \int_{f_{min}}^{f_{max}} 2\pi \cdot PSD \cdot f \, df$$

where RMS is the root mean square value of the surface roughness and fmin and fmax are minimum and maximum values of the spatial frequency of the stray radiation.

18. A method according to claim 15, wherein the PSD is established by monitoring with respect to time stray radiation produced by a reference patterning device to produce a pattern image incorporating a plurality of different sized reference features in the image plane, and determining the PSD from an observed effect of flare on the different sized reference features.

19. A method according to claim 15, wherein the PSD is approximated using a fractal model.

20. A method according to claim 15, wherein the effect of flare on the CD of the pattern image is determined by multiplying the Fourier transform of the pattern image by the MTF.

21. A method according to claim 15, wherein the relationship between the CD of the pattern image and the CD of the pattern is determined using a mask error factor (MEF).

22. A method of compensating for the effect of flare due to stray radiation in use of a projection system of a lithographic apparatus to project a radiation beam patterned by a patterning device to produce a pattern image in an image plane, the method comprising:

monitoring the stray radiation as a function of time;
estimating the stray radiation likely to be produced at a predetermined end of lifetime;
determining the likely effect of flare on a critical dimension (CD) of the pattern image at the end of lifetime;
setting the design of the patterning device in such a way as to at least partially offset the likely effect of flare on the CD of the pattern image at the end of lifetime;
establishing a power spectral density (PSD) indicative of a spatial frequency of the stray radiation produced;
establishing the effect of flare on the CD of the pattern image for the current level of stray radiation; and
applying an amount of moving standard deviation MSDxy indicative of an effect of vibration in the image plane such that the sum of the projected change in CD due to changing MSDxy at the end of lifetime and the projected change in CD due to flare at the end of lifetime is substantially constant over the likely lifetime.

* * * * *